US008228045B2

(12) United States Patent
Murdock et al.

(10) Patent No.: US 8,228,045 B2
(45) Date of Patent: Jul. 24, 2012

(54) QUANTIZED VOLTAGE FEED-FORWARD A POWER FACTOR CORRECTION CONTROLLER

(75) Inventors: Matthew Thomas Murdock, Nashua, NH (US); Ulrich B. Goerke, Dover, NH (US)

(73) Assignee: Texas Instruments Incorporated, Dallas, TX (US)

( * ) Notice: Subject to any disclaimer, the term of this patent is extended or adjusted under 35 U.S.C. 154(b) by 938 days.

(21) Appl. No.: 12/152,240

(22) Filed: May 13, 2008

(65) Prior Publication Data

US 2009/0284233 A1 Nov. 19, 2009

(51) Int. Cl.
*G05F 1/70* (2006.01)
*H03M 1/34* (2006.01)

(52) U.S. Cl. ........................................ 323/205; 341/158

(58) Field of Classification Search .................. 386/200, 386/263, 291.326; 379/67.1; 712/1; 323/205; 341/155, 158

See application file for complete search history.

(56) References Cited

U.S. PATENT DOCUMENTS

| | | | | |
|---|---|---|---|---|
| 6,373,423 | B1 * | 4/2002 | Knudsen | 341/159 |
| 6,850,180 | B2 * | 2/2005 | Hales | 341/162 |
| 2002/0130799 | A1 * | 9/2002 | Yang et al. | 341/138 |
| 2007/0159866 | A1 * | 7/2007 | Siri | 363/95 |

* cited by examiner

*Primary Examiner* — Gary L Laxton
*Assistant Examiner* — Henry Lee, III
(74) *Attorney, Agent, or Firm* — William B. Kempler; Wade J. Brady, III; Frederick J. Telecky, Jr.

(57) ABSTRACT

A quantized voltage feed-forward (QVFF) circuit and integrated circuits using this technique. The QVFF circuit includes a plurality of comparators in combination with a logic control circuit. The comparators are structured and arranged to establish various voltage threshold levels, each providing a digital state signal representative of the sensed input voltage level. The logic control circuit is structured and arranged to use the digital input signals from the comparators to output a voltage feed-forward factor ($K_{VFF}$) signal that is representative of the $V^2_{rms}$ voltage. Output from the logic control circuit is provided to an analog signal multiplier and used to shape an input current reference ($I_{MO}$) waveform. This allows detection of changes in the rms level of the input voltage on the half-cycle of the AC line voltage, resulting in a rapid response to line voltage changes. Because the $K_{VFF}$ factor signal contains no AC ripple component, it does not contribute to THD of the input current reference, $I_{MO}$.

24 Claims, 3 Drawing Sheets

QUANTIZED VOLTAGE FEED-FORWARD A POWER FACTOR CORRECTION CONTROLLER

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention discloses a line voltage feed-forward circuit for a power factor correction controller or other integrated circuit and, more particularly, pertains to a quantized, voltage feed-forward device that eliminates low-frequency filtering and provides a fast response to line voltage changes and to methods and systems using the same.

Power factor correction (PFC) refers to a process to offset or improve the undesirable effects of non-linear electric loads that contribute to a power factor (PF) that is less than unity. In pertinent part, these effects involve the phase angle between the voltage and the harmonic content of the current. When the voltage and current are in phase, the PF is unity, but when the voltage and current are not in phase the PF is some value less than 1.

PFC controllers often rely on feed-forward of some scaled function of the alternating current (AC) line voltage to stabilize the input-to-output gain of the voltage loop. Conventionally, the scaled function of the AC line voltage corresponds to the root-mean-square (rms) level of the input voltage ($V_{rms}$). For example, typically, the input $V_{rms}$ capability of much of the world's electronic equipment ranges between about 264 volts and about 85 volts, which is roughly a 3-to-1 range. The variation of control loop gain under these conditions, however, is about 10-to-1. By incorporating $V_{rms}$ feed-forward into the control loop function, loop gain is stabilized, making frequency compensation easier and loop response to disturbances faster.

Conventional voltage feed-forward (VFF) circuits used in connection with analog signals typically include diodes and an RC network, respectively, to rectify and filter the sinusoidal line voltage. More particularly, conventional VFF circuits represent the input $V_{rms}$ level of the line voltage by deriving the near-DC voltage level from a scaled waveform proportional to the rectified input voltage after the voltage has been averaged using a low-pass filter (LPF). Controller circuitry then mathematically squares the value of the voltage and further scales the squared term to determine the magnitude of the input current reference waveform controlled by the PFC integrated circuit.

Problematically, if the RC network is adapted to provide the least amount of filtering, remnant, low-frequency (e.g., twice the line frequency) AC signals are still present on the near-DC voltage in the waveform. Even though the magnitude of the low-frequency AC signals may only be measured in milli-volts ("ripple"), harmonic distortion, including $3^{rd}$-order harmonic distortion, is introduced into the controlled AC reference waveform.

Alternatively, to substantially eliminate $3^{rd}$-order harmonic distortion, the RC network can be adapted to provide "heavier" filtering. Disadvantageously, "heavier" filters are slower and operate at lower frequencies, which may cause the AC reference signal to lag changes in the AC input by several cycles before the input current reference waveform reaches a steady-state. Signal lag, hence, can result in output over- and under-voltage conditions, which cause other detrimental consequences.

Making a trade-off between acceptable total harmonic distortion (THD) and a fast response to AC line transients is, therefore, necessary. Accordingly, it would be desirable to provide a quantized, voltage feed-forward (QVFF) device that eliminates the need to remove low-frequency harmonic content using RC filtering networks. Furthermore, it would be desirable to provide a QVFF device that can adjust the input current reference waveform within every half-cycle. It also would be desirable to provide a QVFF device that provides a fast response to line voltage changes and that removes ripple-induced, $3^{rd}$-order harmonic distortion.

BRIEF SUMMARY OF THE INVENTION

A quantized, voltage feed-forward (QVFF) circuit and integrated circuits and methods using the same are disclosed. The QVFF circuit includes a plurality of comparators in combination with a logic control circuit. The comparators are structured and arranged to establish various voltage reference threshold levels, each providing a digital state signal representative of the sensed instantaneous input voltage. The logic control circuit is structured and arranged to use the digital signals from the comparators to generate a discrete, voltage feed-forward coefficient ($K_{VFF}$) signal that is representative of the $V^2_{rms}$ voltage or any conceivable scaled function of the AC line voltage. Output from the logic control circuit is provided to an analog signal multiplier and is used to shape an input current reference signal 46 ($I_{MO}$) waveform.

The QVFF circuit replaces the prior art's continuous $V^2_{rms}$ feed-forward factor with a series of discrete, non-continuous $K_{VFF}$ factor signals that correspond to consecutive, sequentially-increasing, limited ranges of $V_{rms}$ levels. More specifically, the previously mentioned range of 85 volts and 264 volts can be broken up into a plurality of narrow band ranges, each band range having a corresponding, unique $K_{VFF}$ factor that is deemed representative of the entire range. This allows detection of changes in the rms-level of the instantaneous input voltage on the half-cycle of the AC line voltage, resulting in a rapid response to line voltage changes. Because the $K_{VFF}$ factor contains no AC ripple component, it does not contribute to THD of the input current reference signal, $I_{MO}$.

BRIEF DESCRIPTION OF THE SEVERAL VIEWS OF THE DRAWINGS

The invention will be more fully understood by reference to the following Detailed Description of the invention in conjunction with the Drawings, of which.

DETAILED DESCRIPTION OF THE INVENTION

Figure 1:
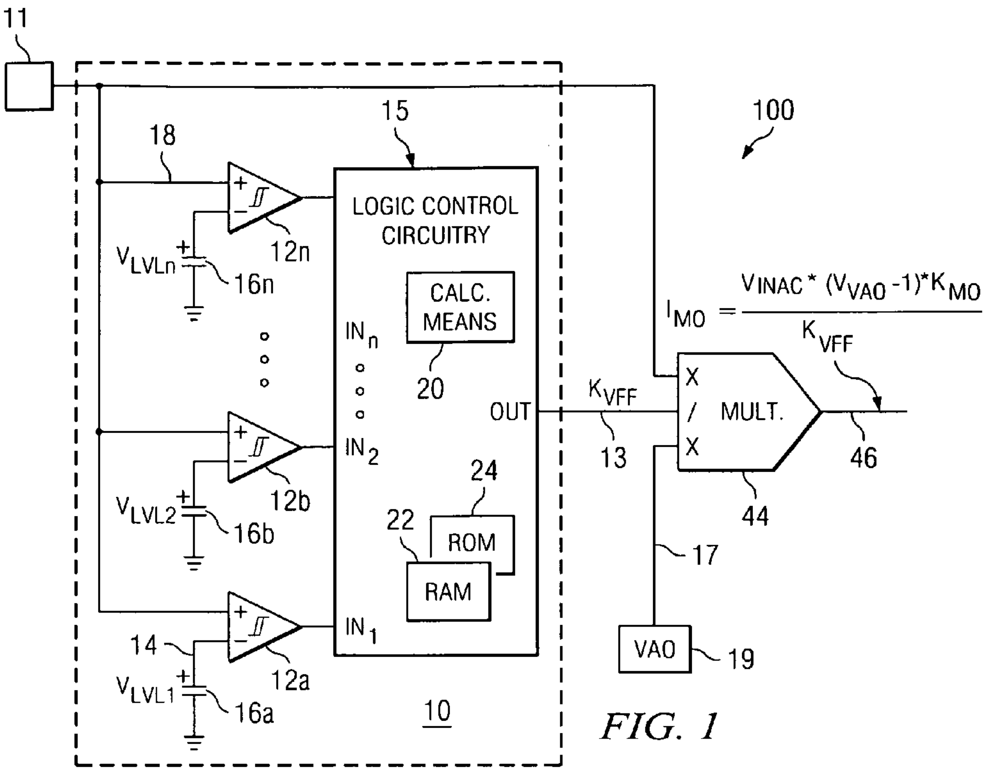
FIG. 1 shows an illustrative diagram of a quantized, voltage feed-forward system and a portion of a power factor correction controller in accordance with the present invention.

Referring to FIG. 1, a quantized, voltage feed-forward (QVFF) device 10 for adjusting, modifying, and influencing an output current reference waveform for use with a power factor correction (PFC) controller or other integrated circuit is shown. The QVFF device 10 includes a plurality of comparators 12 in combination with a logic control circuit (LCC) 15. The comparators 12 monitor a common rectified AC line voltage or, more specifically, a signal 11 representing a scaled waveform, $V_{INAC}$, that is proportional to the rectified input voltage, $V_{IN}$. Moreover, each comparator generates a state signal based on the relationship between the magnitude of the sensed input voltage 11 and the reference voltages 16 associated with the comparators 12.

The LCC 15 is adapted to generate a signal representing the voltage feed-forward coefficient ($K_{VFF}$) 13 every half-cycle based on the combined state signals from the plurality of comparators 12. For the purpose of this disclosure, the voltage feed-forward coefficient ($K_{VFF}$) signal 13 is representative of the square of the $V_{rms}$ input voltage level ($V^2_{rms}$). However, those of ordinary skill in the art can apply the teachings of the present invention to any conceivable function of the line voltage, e.g., by squaring, scaling, and the like.

Advantageously, the voltage feed-forward coefficient ($K_{VFF}$) signal 13 of the present invention contains no AC ripple component. Accordingly, remnant signals that might otherwise contribute to total harmonic distortion (THD) are absent without requiring any low-frequency filtering.

The LCC 15 provides the voltage feed-forward coefficient ($K_{VFF}$) signal 13 to an analog signal multiplier 44, which also receives as input the scaled rectified input voltage 11, $V_{INAC}$, and an error amplification signal 17, $V_{AO}$. The signal multiplier 44 is adapted to use the error amplification signal 17, $V_{AO}$, from a voltage error amplifier 19, in part, to compensate for any mathematical difference between the actual $V^2_{rms}$ value of the $V_{INAC}$ signal 11 and the $K_{VFF}$ signal 13, to form or shape the waveform of the input current reference signal 46, $I_{MO}$.

Comparators

Comparators are state machines that are used extensively to determine whether or not an input signal is higher or lower than a predetermined reference voltage. For example, an output voltage HI (1) signal generated by a comparator may indicate that the input signal is greater in magnitude than a predetermined reference voltage while an output voltage LO (0) signal generated by the comparator may indicate that the input signal is lesser in magnitude than a predetermined reference voltage.

According to the present invention, each of the plurality of comparators 12 is adapted to generate a digital output signal corresponding to the relationship between the scaled and rectified input voltage 11, $V_{INAC}$, and a predetermined, sequentially-increasing threshold level reference voltage, $V_{LVL1}$, $V_{LVL2}$ . . . $V_{LVLn}$, (where n corresponds to the number of comparators) that is unique to each corresponding comparator 12. To that end, each comparator 12*a*, 12*b*, . . . 12*n* is structured and arranged so that the scaled and rectified input voltage 11, $V_{INAC}$, is input at the positive terminal 18 of each of the comparators 12*a*, 12*b*, . . . 12*n*, while a discrete, predetermined, sequentially-increasing (DC) threshold level reference voltage, $V_{LVL1}$, $V_{LVL2}$ . . . $V_{LVLn}$, is input at the respective negative terminals 14 of each of the comparators 12*a*, 12*b*, . . . 12*n*. Although FIG. 1 shows a plurality of DC voltage sources, 16*a*, 16*b*, . . . 16*n*, being used to establish the threshold level reference voltages, $V_{LVL1}$, $V_{LVL2}$ . . . $V_{LVLn}$, alternatively, the reference voltage can be generated by taps in a precision resistor-divider network, and the like.

Each of the predetermined, sequentially-increasing (DC) threshold level voltages, $V_{LVL1}$, $V_{LVL2}$ . . . $V_{LVLn}$, corresponds to a discrete reference or cut-off voltage. Predetermined, discrete $V_{rms}$-level ranges or bands of voltages are defined between reference or cut-off voltages. A unique, predetermined voltage feed-forward coefficient ($K_{VFF}$), which is representative of the approximate $V^2_{rms}$ of any voltage within the $V_{rms}$-level range, is associated with each $V_{rms}$-level range. Thus, the $V_{rms}$-level range determines the respective voltage feed-forward coefficient ($K_{VFF}$) signal 13 applied to the signal multiplier 44. As will be described in greater detail below, digital state signals from each of the comparators 12 identify the instantaneous $V_{rms}$-level range relatively quickly, e.g., at each half-cycle of the input voltage sinusoid, without having to measure the exact magnitude of the scaled and rectified input voltage 11, $V_{INAC}$.

The number (n) of comparators 12*a*, 12*b*, . . . 12*n* in the device 10, which is to say, the number of threshold level reference voltages, $V_{LVL1}$, $V_{LVL2}$ . . . $V_{LVLn}$, can be any practical, positive integer. The number (n) further defines the number of $V_{rms}$-level ranges. In selecting the number (n) of comparators 12 for a particular application, the degree of circuit complexity and manufacturing cost should be balanced with the degree of $V_{AO}$ signal compensation necessary.

For example, if only a few discrete, $V_{rms}$-level ranges are desired, i.e., the number (n) of comparators 12 is relatively low, the bandwidth of each $V_{rms}$-level range can be relatively broad. As a result, within any $V_{rms}$-level range, the mathematical difference between the $K_{VFF}$ coefficient that is representative of all of the input voltages within the entire $V_{rms}$-level range and the actual $V^2_{rms}$ can be substantial. Consequently, at the extreme (upper and lower) limits of the $V_{rms}$-level band, the voltage error amplifier 19 must be adapted to provide greater compensation in recognition of these relatively major differences when generating a voltage error amplification signal 17, $V_{AO}$.

On the other hand, if the number (n) of comparators 12 is relatively high, the bandwidths of the $V_{rms}$-level ranges between threshold voltages can be relatively narrow. Hence, the mathematical differences between the representative $K_{VFF}$ coefficient and the actual $V^2_{rms}$ may only require modest error adjustments from the voltage error amplifier 19. In either instance, output from the voltage error amplifier 19 is necessary to correct for any differences between the unique, predetermined $K_{VFF}$ factor signal 13 and the actual $V^2_{rms}$.

In a specific application of the technology in connection with a PFC controller, the number (n) of comparators 12 was selected to provide eight (n) discrete, $V_{rms}$-levels by including eight (n=8) threshold level reference voltages, $V_{LVL1}$, $V_{LVL2}$, . . . $V_{LVL8}$. The reference/threshold voltage 16*a* at the lowest threshold level, $V_{LVL1}$, was set at 0.8 volts; the reference/threshold voltage 16*b* at the subsequent threshold level, $V_{LVL2}$, was set 0.2 volts higher at 1.0 volts; the reference/threshold voltage 16*c* (not shown) at the next threshold level, $V_{LVL3}$, was set 0.2 volts higher at 1.2 volts; the reference/threshold voltage 16*d* (not shown) at the next threshold level, $V_{LVL4}$, was set 0.2 volts higher at 1.4 volts; and so forth. The reference/threshold voltages for each threshold level are summarized in Table I.

With the reference/threshold voltages 16*a*-16*n* so set, the $V_{rms}$-level range or band associated with the uppermost comparator 12*n*, i.e., $V_{rms}$-level 8, is any voltage above the reference/threshold voltage 16*n* at the highest voltage level, $V_{LVL8}$, (2.6 volts); at the next comparator 12*g* (not shown) in $V_{rms}$-level 7, the $V_{rms}$-level band is between the reference/threshold voltage 16*n* at the highest threshold level (2.6 volts) and the reference/threshold voltage 16*g* at the next highest threshold level, $V_{LVL7}$, (2.25 volts); and so forth. At the lowest level comparator 12*a*, $V_{rms}$-level 1 is defined by the reference/threshold voltage 16*a* at the lowest threshold level (0.8 volts) and the next lowest threshold level (1.0 volts). $V_{rms}$-level ranges are summarized in Table I.

TABLE I

| VRMS LEVEL | VOLTAGE LEVEL THRESHOLD DESIGNATION | THRESHOLD VOLTAGE FOR GIVEN LEVEL (V) | UPPER LIMIT OF VRMS LEVEL RANGE (V) | REFERENCE VOLTAGE FOR $K_{VFF}$ FACTOR (V) |
|---|---|---|---|---|
| 1 | $V_{LVL1}$ | 0.8 | 1.0 | 0.9 |
| 2 | $V_{LVL2}$ | 1.0 | 1.2 | 1.1 |
| 3 | $V_{LVL3}$ | 1.2 | 1.4 | 1.3 |
| 4 | $V_{LVL4}$ | 1.4 | 1.65 | 1.525 |
| 5 | $V_{LVL5}$ | 1.65 | 1.95 | 1.8 |
| 6 | $V_{LVL6}$ | 1.95 | 2.25 | 2.1 |
| 7 | $V_{LVL7}$ | 2.25 | 2.6 | 2.425 |
| 8 | $V_{LVL8}$ | 2.6 | 3.0 | 2.775 |

By design, off-the-shelf comparator circuits include a relatively small, internal hysteresis, to compensate for the relatively slow voltage signals. Internal hysteresis avoids operational "chatter" or cross-talk as the sensed input voltage 11, $V_{INAC}$, crosses any threshold. More particularly, internal hysteresis prevents chatter by causing the reference voltage 16 to change suddenly in a direction opposite that in which the input signal is moving. This feature ensures that the comparator 12 only generates one output toggle, which is to say that this feature only allows one change in output state.

Those of ordinary skill in the art can appreciate that the number (n) of comparators 12, number (n) and bandwidth of the $V_{rms}$-level ranges, and the actual threshold reference voltage levels, $V_{LVLn}$, can be fixed or varied as desired. For example, the range of threshold reference voltage levels can be derived linearly; can include non-linear variations (as described above) such as logarithmic or other variations or can include any combination thereof.

Optionally, at least one of the plurality of comparators 12 and/or the device 10 itself can include means to provide an additional level of hysteresis in connection with its respective reference voltage 16. As previously mentioned, conventional comparators inherently include some internal hysteresis. The means for providing an additional level of hysteresis of the present invention is adapted to control chatter that may begin when the sensed input voltage is within a few milli-volts (mV) of the active reference voltage and typically ends when the sensed voltage is more than a few milli-volts (mV) away from the active reference voltage. The active reference voltage (or the "active level") refers to the most recent past history of the $V_{INAC}$ input signal 11.

For example, the means to provide an additional level of hysteresis can be incorporated into at least one of the comparators 12 or into the device 10 itself so that, once the output from a comparator 12 changes state to a voltage HI (1)—designating that the sensed input voltage exceeds the comparator's 12 reference voltage 16—the means to provide an additional level of hysteresis simultaneously and automatically decreases the reference voltage 16 of the voltage HI comparator 12 by, for example, five percent. In other words, if a threshold reference voltage set at 1 volt is exceeded, then for subsequent sensed input signals, the threshold reference voltage is reduced by five percent to 0.95 volts. As a result, to generate the same output as before, the sensed input signal can be five percent lower, which is to say, 50 mV lower, than the actual reference voltage 16. Advantageously, the tripped comparator 12 stays tripped even if the subsequent sensed input signal is slightly less than the reference voltage 16 as long as it is within five percent of the reference voltage 16. The benefit in providing an additional level of hysteresis is that low-levels of noise, waviness, general non-idealities, and the like are tolerated.

All or only a few of the comparators 12 can be adapted to incorporate some percentage of additional hysteresis on its reference voltage 16. For example, the plurality of comparators 12 can be structured and arranged so that only the highest level comparator triggered for a given half-cycle activates and retains the additional hysteresis, the lower comparators returning to their predetermined threshold level reference voltages.

Voltage Feed-Forward Factor

Before discussing the structure and function of the LCC 15, the quantized, voltage feed-forward factor ($K_{VFF}$) signal 13 generated thereby will be discussed in brief. As previously mentioned, the present invention substitutes a discontinuous series of discrete, quantized, timed $K_{VFF}$ factor signals 13 for the conventional, continuous, analog $V^2_{rms}$ feed-forward signal.

Conventionally, the input current reference 46, $I_{MO}$, waveform formed by the signal multiplier 44 can be calculated using the equation:

$$I_{MO} = \frac{V_{INAC} \cdot (V_{VAO} - 1) \cdot K_{MO}}{K_{VFF}} \quad \text{EQN. 1}$$

where $V_{INAC}$ corresponds to the scaled and rectified AC line voltage signal 11 from the AC voltage source, $V_{VAO}$ corresponds to the output voltage error amplification signal 17 from a signal error amplifier 19, and $K_{MO}$ is a pre-determined conversion factor having units of amperes per volts-squared or micro-amperes per volts-squared. By inspection, the resulting input current reference signal 46, $I_{MO}$, is proportional to the AC line voltage signal 11 and to the voltage output error signal 17 but inversely proportional to the quantized, voltage feed-forward $K_{VFF}$ factor 13.

As mentioned previously, a unique, pre-determined $K_{VFF}$ factor is attributed to each $V_{rms}$-level band. For example, the $K_{VFF}$ factor for the uppermost comparator 12*n* and highest threshold level, can correspond to the $K_{VFF}$ factor of the approximate mid-point reference voltage of the $V_{rms}$-level range, i.e., 3.0 volts to 2.6 volts, or 2.775 volts; the unique $K_{VFF}$ factor attributed to the next highest threshold level can correspond to the $K_{VFF}$ factor of the approximate mid-point reference voltage of the $V_{rms}$-level range, i.e., 2.6 volts to 2.25 volts, or 2.425 volts; and so forth. For the lowest threshold level, the unique $K_{VFF}$ factor can correspond to the $K_{VFF}$ factor of the respective mid-point reference voltage of the $V_{rms}$-level range, i.e., 0.8 volts to 1.0 volts, or 0.9 volts. Mid-point reference voltages for each $V_{rms}$-level are summarized in Table I.

Although, for illustrative purposes only, the unique $K_{VFF}$ factor representative of each $V_{rms}$-level has been defined herein as the $K_{VFF}$ factor corresponding to the mid-point voltage of each $V_{rms}$-level band (as described above), the unique $K_{VFF}$ factor, alternatively, can correspond to the log-midpoint voltage of the $V_{rms}$-level range or to any point within the $V_{rms}$-level range so deemed to be advantageous for a particular application. Moreover, the unique $K_{VFF}$ factor for each $V_{rms}$-level range can be predetermined as for a hardwired application or can be calculated as in a firmware-of software-controlled application.

When predetermined $K_{VFF}$ factors are used, they are unique and are representative of all sensed voltages levels within the discrete $V_{rms}$-level range to which they correspond. Advantageously, by assigning a specific $K_{VFF}$ factor to represent an entire $V_{rms}$-level range, changes in rms level can be detected more rapidly, which is to say, within every half-cycle. Furthermore, there is no ripple component in the $K_{VFF}$ factor signal 13, hence the $K_{VFF}$ factor signal 13 as used in EQN. 1 does not contribute to THD.

However, because a single $K_{VFF}$ factor is pre-selected to represent the entire bandwidth of a $V_{rms}$-level range, the $K_{VFF}$ factor signals 13 generated by the LCC 15 are truly only representative of one $V_{rms}$ input voltage within the bandwidth. For discussion purposes only, this is assumed to be the mid-point of the bandwidth or some other discrete, predetermined voltage level (hereinafter, collectively referred to as the "mid-point voltage") within a specific $V_{rms}$-level range. Accordingly, if the sensed, scaled rectified input voltage 11, $V_{INAC}$, does not correspond to the mid-point voltage of a specific $V_{rms}$-level range, the resultant $K_{VFF}$ factor is not an exact measure of the $V^2_{rms}$ input voltage and correction is required. The voltage error amplifier 19 is adapted to compensate for minor differences between the actual $V^2_{rms}$ and the $K_{VFF}$ factor signal 15 representation of the $V^2_{rms}$.

Logic Control Circuit

The LCC 15 is adapted to generate a discrete $K_{VFF}$ factor signal 13 that is representative of a $V^2_{rms}$ feed-forward factor (or any scaled function of the input signal) every half-cycle based on digital output from each of the plurality of comparators 12. The LCC 15 can be hardwired or can include means 20 for calculating and generating the discrete $K_{VFF}$ factor signal 13.

When not hardwired, the LCC 15 and calculating means 20 include memory such as volatile random access memory (RAM) 22 and/or non-volatile, read-only memory (ROM) 24. The ROM 24 stores, inter alia, applications, calculation programs, driver programs, and the like. The RAM 22 provides suitable memory for running at least one of the applications, calculation programs, driver programs, and the like that are stored in ROM 24 or in some other software, firmware or hardware. The RAM 22 can include suitable memory for storing the most recent past history, i.e., the previously set or "active level", of the $V_{INAC}$ input signal and/or the previously generated $K_{VFF}$ factor signal 13. Those of ordinary skill in the art can appreciate that one or more buffers, registers, and/or sequential circuits, e.g., latches, flip-flops, and the like, can also be used to save the most recent past history of the $V_{INAC}$ input signal 11 and/or the previously generated $K_{VFF}$ factor signal 13.

Figure 2:
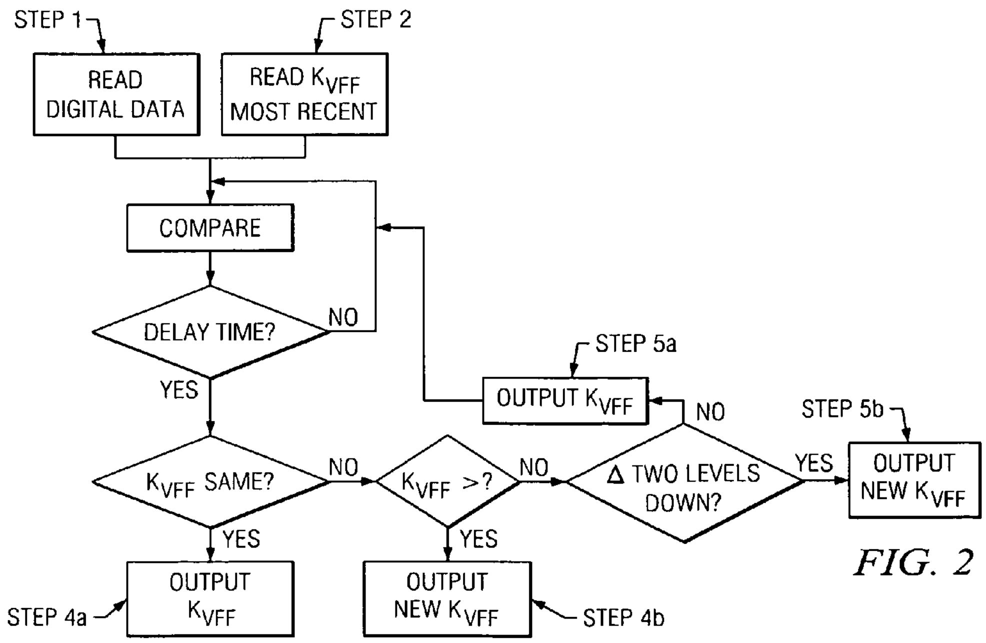
FIG. 2 shows a flow chart of a method of shaping an input current waveform in accordance with the present invention.
Figure 3:
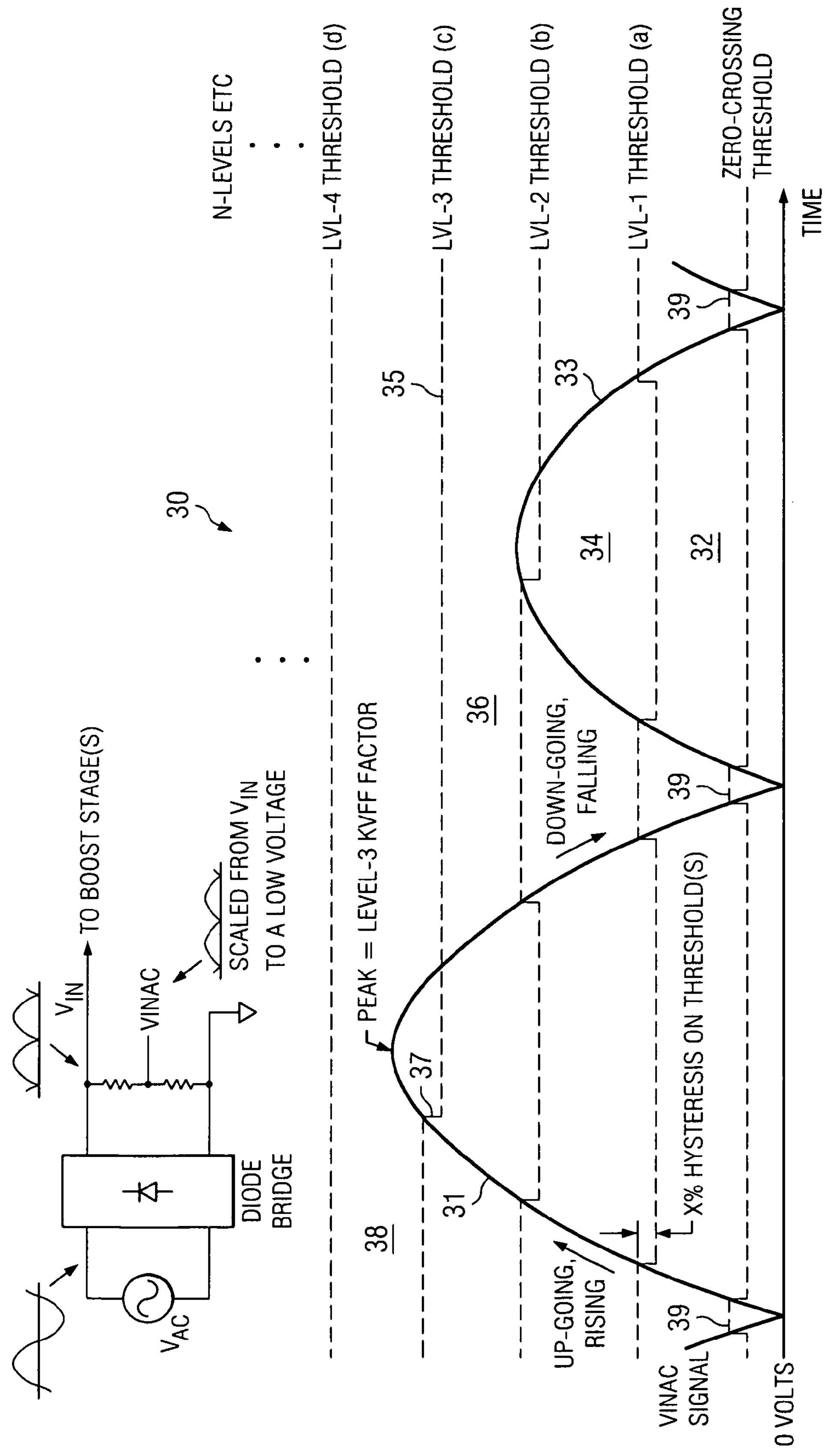
FIG. 3 shows an illustrative diagram of a scaled and rectified $V_{INAC}$ waveform characteristic of a sinusoidal AC source.

The operation and function of the LCC 15 and, more particularly, the calculating means 20 are shown in the flow chart in FIG. 2. To facilitate discussion, illustrative characteristically sinusoidal waveforms 30 and characteristically non-sinusoidal waveforms 40 of the sensed input voltage 11, $V_{INAC}$, are shown, respectively, in FIG. 3 and FIG. 4. FIG. 3 includes successively-increasing threshold level reference voltages $V_{LVL1}$, $V_{LVL2}$, $V_{LVL3}$, and $V_{LVL4}$ and corresponding $V_{rms}$-level ranges 32, 34, 36, and 38. The first half-cycle 31 peaks between threshold level reference voltages $V_{LVL3}$ and $V_{LVL4}$ while the second half-cycle 33 peaks at or very near the threshold level reference voltage $V_{LVL2}$. A five-percent hysteresis 37 is shown with respect to threshold level reference voltage $V_{LVL3}$ and, more particularly, FIG. 3 shows that, after the rising or leading edge of the voltage waveform 31 trips the comparator 12*c* (not shown) corresponding to threshold level reference voltage $V_{LVL3}$, the magnitude of the threshold reference voltage level $V_{LVL3}$ is reduced by five percent automatically. The five-percent hysteresis-adjusted threshold level reference voltage $V_{LVL3}$ is shown in FIG. 3 as reference number 35.

As mentioned above, the unique $K_{VFF}$ factor signal 13 generated at every half-cycle depends on the presently sensed value of the $V_{INAC}$ input signal 11 as well as the most recent past history, i.e., the "active level", of the $V_{INAC}$ input signal 11 and/or the previously generated $K_{VFF}$ factor signal 13. Consequently, in a first step, the LCC 15 and calculating means 20 read the incoming (digital) data signals from each of the plurality of comparators 12 (STEP 1). The incoming data signals establish the immediate peak voltage level of the $V_{INAC}$ input signal 11, the corresponding threshold level reference voltage, the corresponding $V_{rms}$-level range, and/or the corresponding mid-point voltage of the $V_{rms}$-level range, which can be determined through hardwiring or can be accessed from look-up tables stored in ROM 24 (STEP 2).

Those of ordinary skill in the art can appreciate that if the threshold level reference voltages, the bandwidth of each VS-level range, and the mid-point voltages of each $V_{rms}$-level range are predetermined and fixed (i.e., in a hardwired application) and, similarly, if each unique $K_{VFF}$ factor is predetermined and fixed with respect to its respective mid-point voltage and/or with respect to the $V_{rms}$-level range, then the terms (threshold $V_{rms}$-level, mid-point voltage, $K_{VFF}$ factor, and $V_{rms}$-level range) essentially become surrogates for the other terms. Hence, for convenience and clarity, the disclosure will refer specifically to actions with respect to the $V_{rms}$-level thresholds. However, what is described with respect to the $V_{rms}$-level thresholds could equally be said about the respective bandwidth mid-point voltage of the same and/or the unique, corresponding $K_{VFF}$ factor.

This would not be true, however, if the mid-point voltage of the $V_{rms}$-level range is non-linear and/or can be varied dynamically or otherwise and/or if the $K_{VFF}$ factor associated with a specific $V_{rms}$-level range and/or corresponding mid-point voltage can be varied. In such instances, those of ordinary skill in the art can adapt the teachings of the fixed case to apply to the variable case. Indeed, static or dynamic, artificial or manual adjustments to the $K_{VFF}$ factor can be effected by inclusion of additional circuitry in the LCC 15 in manners that are well-known to those of ordinary skill in the art.

In a next step, at each half-cycle, the immediate peak $V_{rms}$-level threshold is compared to the "active level" of the $V_{INAC}$ input signal 11 (STEP 3). If the immediate peak $V_{rms}$-level threshold is the same as the "active level" of the $V_{INAC}$ input signal 11, then the $K_{VFF}$ factor signal 13 generated by the LCC 15 (STEP 4*a*) for the half-cycle does not change from the previous output. However, if the immediate peak $V_{rms}$-level threshold exceeds the "active level", the LCC 15 generates a new $K_{VFF}$ factor signal 13 (STEP 4*b*) that corresponds to the new, higher $V_{rms}$-level threshold. The new $K_{VFF}$ factor signal 13 (STEP 4*b*) generated can be provided in an accessible look-up table stored in RAM 22 or ROM 24 or can be calculated using a formula or generated by other means.

For either instance, the $K_{VFF}$ factor signal 13 output by the LCC 15 (STEP 4*a* or STEP 4*b*) will be increased sequentially until a peak $V_{rms}$-level threshold.

is reached. In short, the $K_{VFF}$ factor signal 13 generated by the LCC 15 will remain constant, changing only as a higher $V_{rms}$-level threshold is exceeded due to an increase in the sensed $V_{INAC}$ input signal 11. As previously mentioned, to avoid false peaks, comparisons are made and output generated only after the comparator 12 state signals exceed a particular $V_{rms}$-level threshold for a predetermined delay time, e.g., some time less than 1 milli-second (msec).

Optionally, the LCC 15 can be programmed or structured and arranged so that the $K_{VFF}$ factor signal 13 generated by the LCC 15 (STEP 4*a* or STEP 4*b*) only changes once the sensed $V_{INAC}$ input signal 11 surpasses two $V_{rms}$-level thresholds above the "active level". For example, referring to FIG. 3, if the "active level" corresponds to an $V_{rms}$-level 2 that is established by comparator 12*b*, then the $K_{VFF}$ factor 13 corresponding to $V_{rms}$-level 2 will continue to be output to the signal multiplier 44 until the $V_{INAC}$ input signal 11 sensed exceeds the $V_{rms}$-level threshold for comparator 12*d* ($V_{rms}$-level 4) rather than just the $V_{rms}$-level threshold for comparator 12*c* ($V_{rms}$-level 3). Employment of the "two-up" option provides greater assurance that the $K_{VFF}$ factor signal 13 output by the LCC 15 does not result in an over- or under-estimation of the input current due to a transient disturbance.

Peak detection or any change in $V_{rms}$-level can also be determined by a delayed comparator 12 response, which avoids changing levels on noise, ringing, and/or other spurious disturbances on the sensed rectified input voltage signal, $V_{INAC}$, 11. However, to ensure, for example, that the detected peak is a true peak, the LCC 15 is adapted to disregard any signal or combination of signals that does not exceed a particular threshold level reference voltage for longer than for a predetermined delay time, e.g., less than about 1 msec. Thus, true peaks can be separated from line noise or other brief disturbances.

The duration of the predetermined delay time depends, inter alia, on the input AC line frequency. It can be a fixed time or a variable amount of time. Moreover, the delay time can be determined dynamically and/or it can be determined as a function of pre-established criteria. Typically, a longer delay time is preferred with low frequency (50 to 60 Hz) inputs and a shorter delay is preferred with relatively higher, avionics frequencies (360 to 1000 Hz). For all cases, the delay time should not exceed 1 msec.

If the peak of the sensed $V_{INAC}$ input signal 11 is less than the voltage associated with the "active level", the sensed $V_{INAC}$ input signal 11 is decreasing rather than increasing. When the sensed $V_{INAC}$ input signal 11 is decreasing, the LCC 15 can be programmed so that the $K_{VFF}$ factor signal 13 generated by the LCC 15 (STEP 5*a* or STEP 5*b*) only changes after the sensed $V_{INAC}$ input signal 11 falls below the next two $V_{rms}$-level thresholds. For example, if the "active level" of the most recent $K_{VFF}$ factor signal 13 generated by the LCC 15 corresponds to $V_{rms}$-level 6 for comparator 12*f* (not shown) and the peak of the sensed input signal 11, $V_{INAC}$, is greater than $V_{LVL4}$ but less than $V_{LVL5}$, i.e., $V_{rms}$-level 4, then that $K_{VFF}$ factor signal 13 corresponding to the $V_{rms}$-level 6 will continue to be output to the signal multiplier 44 until the sensed $V_{INAC}$ input signal 11 falls below the $V_{rms}$-level threshold for comparator 12*b* for the predetermined time delay. Once the sensed $V_{INAC}$ input signal 11 reaches the $V_{rms}$-level 2 associated with comparator 12*b*, then the $K_{VFF}$ factor signal 13 generated by the LCC 15 would correspond to the $K_{VFF}$ factor for the $V_{rms}$-level threshold associated with the comparator of the most recent peak attained, i.e., $V_{rms}$-level 4.

The purpose of the "two-down" feature likewise is, primarily, to avoid altering the $K_{VFF}$ factor signal 13 too quickly due to a false "peak". This could result in over-statement or under-statement of the input current reference 46, $I_{MO}$. An exception to the "two-down" feature occurs when the most recent peak attained corresponds to the next-to-lowest comparator 12*b*, i.e., $V_{rms}$-level 2, in which case the $K_{VFF}$ factor signal 13 associated with the "active level" will continue to be output to the signal multiplier 44 until the sensed $V_{INAC}$ input signal 11 reaches the $V_{rms}$-level threshold for the lowest comparator 12*a*. Once the sensed $V_{INAC}$ input signal 11 reaches the $V_{rms}$-level threshold associated with lowest comparator 12*a*, then the $K_{VFF}$ factor signal 13 generated by the LCC 15 would correspond to the $K_{VFF}$ factor for the $V_{rms}$-level threshold associated with comparator 12*b* of the most recent peak attained, i.e., $V_{rms}$-level 2.

Those of ordinary skill in the art can appreciate that other factors may warrant changing the $K_{VFF}$ factor signal 13 on reduced $V_{INAC}$ input signal peaks 31 or 33. For example, the $K_{VFF}$ factor signal 13 instead can be changed only once the $V_{INAC}$ input signal 31 or 33 falls below the lowest (bottommost) $V_{rms}$-level threshold, i.e., threshold level reference voltage $V_{LVL1}$, and/or when the $V_{INAC}$ input signal 31 falls below a fixed, "zero-crossing" threshold 39. "Zero-crossings" 39 for the sensed rectified input signal correspond to the $V_{INAC}$ input signal 31 or 33 that fall below a predetermined, relatively-low threshold that is arbitrarily close to zero volts.

Figure 4:
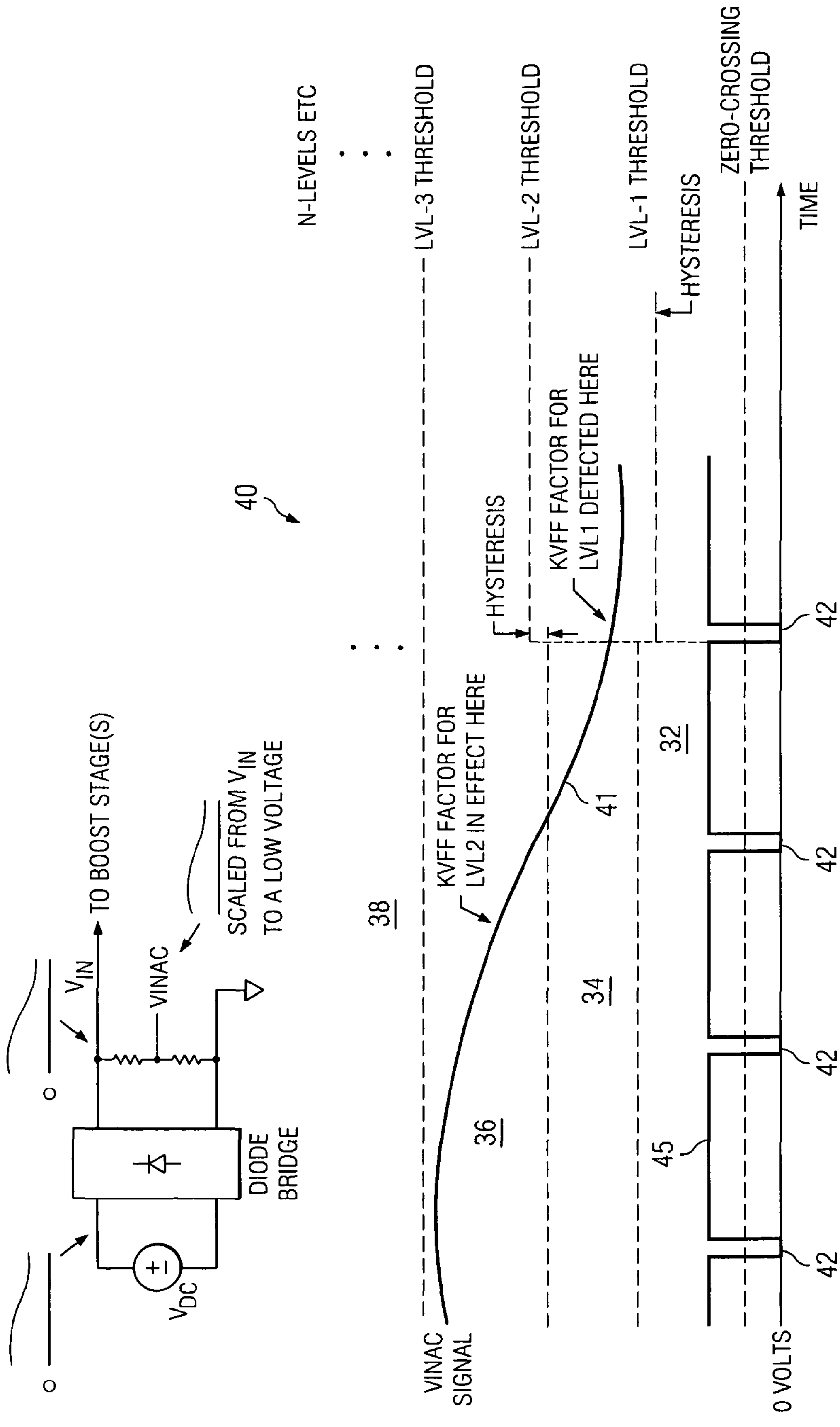
FIG. 4 shows an illustrative diagram of a $V_{INAC}$ waveform characteristic of a non-sinusoidal source.

When dealing with slowly-varying DC voltage input signals and/or for characteristically non-sinusoidal signals 40 such as are shown in FIG. 4, in which there are no zero-crossings, an artificially low-going "zero crossing" substitute pulse 45 can be added to the signal or to the LCC 15 at a suitable repetition rate. The "zero crossing" pulse 45 is a periodic internal pulse train that is generated to provide an artificial zero-crossing signal on trailing edges 42 of the waveform 45 when there are no zero-crossings in the signal 41.

The "zero crossing" pulse train 45 artificially locks-in or stores an "active level" at each artificial zero-crossing point 42. This facilitates detecting decreasing DC-input voltage changes.

PFC Controller

A portion of a PFC controller 100 that includes a quantized, voltage feed-forward 10 circuit is also shown in FIG. 1. The PFC controller sub-circuit 100 combines the plurality of comparators 12 and logic control circuit 15 of the previously described QVFF circuit 10 with a continuous, analog signal multiplier 44 and a voltage error amplifier 19.

The signal multiplier 44 uses the sensed input signal 11, $V_{INAC}$, the $K_{VFF}$ factor signal 13, and the voltage error amplifier output, $V_{VAO}$, 17 to determine, e.g., using EQN. 1, the input current reference, $I_{MO}$, waveform 46 to the PFC or other IC.

The PFC controller operates in a continuous conduction mode (CCM) that, in line-operated systems having power levels greater than approximately 75 W, reduces total harmonic distortion (THD) of the AC input current. Advantageously, the two-phase, average current-mode PFC controller maximizes usable outlet power and better accommodates extreme variations and disturbances in AC line voltages levels. Line voltage levels include such levels found worldwide as well in the United States.

When continuous input signals are transmitted to and received by the signal multiplier 44 without any time lag, the response time for changes of input current merely becomes a function of the output voltage error. However, when there is a time lag between the AC voltage signal 11 and the voltage feed-forward coefficient signal 13, which can occur with heavy filtering, under-voltage or over-voltage may ensue.

Each $V_{rms}$-level corresponds to a predetermined operating scaling factor for the analog multiplier 44. Output from the multiplier 44 is, thus, controlled relative to the state of the measured AC input voltage, $V_{AC}$.

More specifically, the digital output from each of the plurality of comparators 12 is transmitted to the logic control circuit 15, which is structured and arranged to determine the transition between VFF levels defined by each of the plurality of comparators 12 every half-cycle. As a result, the analog multiplier 44 can respond to line transients instantaneously or substantially instantaneously, which is to say within a single half-cycle.

$V_{rms}$-level transition is based on a comparison between the existing level of operation and the measured magnitude of the instantaneous AC input voltage. The QVFF device 10 improves transient response, stabilizing the input current more rapidly.

Although the invention has been described in connection with a PFC controller, the invention is not to be construed as being limited thereto. Those of ordinary skill in the art will appreciate that variations to and modification of the above-described device, system, and method are possible. Accordingly, the invention should not be viewed as limited except as by the scope and spirit of the appended claims.

For example, an embodiment of the invention has been described in which $V_{rms}$-level thresholds are predetermined and fixed. However, the reference thresholds can be dynamic or programmable. Optionally or alternatively, the zero-reference can be variable, to compress or expand the overall applicable $V_{rms}$-level range for other applications using other input voltage ranges.

Also, the $K_{VFF}$ factor, which represents the $V^2_{rms}$ values for a given $V_{rms}$-level, can be implemented instead as voltages or currents or some combination of the two, as necessary to interface with other circuits associated with the controller.

What is claimed is:

1. A quantized voltage feed-forward device for providing a quantized voltage feed-forward signal, the device comprising:

a plurality of comparators, each of the plurality of comparators monitoring an instantaneous input voltage signal and to compare the instantaneous input voltage with a discrete, predetermined reference voltage level, and to generate a plurality of digital state signals representative of said comparison; and a logic control circuit that processes the digital state signals from each of the plurality of comparators at an end of each half cycle in the input voltage signal to always determine a peak in the input voltage signal and to generate a discrete voltage feed-forward factor output that is always representative of a function of the peak input voltage in that half cycle.

2. The device as recited in claim 1, wherein the voltage feed-forward output is a voltage feed-forward factor ($K_{VFF}$) signal having no AC ripple component.

3. The device as recited in claim 2, wherein the voltage feed-forward factor ($K_{VFF}$) signal can vary as a discrete, non-continuous value.

4. The device as recited in claim 2, wherein the voltage feed-forward factor ($K_{VFF}$) signal has long-term, discrete values in which transitions between said values are made in a smooth, continuous manner.

5. The device as recited in claim 1, wherein the function of the input voltage is the square of a scaled root-mean-square voltage ($V^2_{rms}$).

6. The device as recited in claim 1, wherein the quantized voltage feed-forward signal is dynamically- or variably-adjustable.

7. The device as recited in claim 1, wherein the discrete predetermined reference voltage levels of each of the plurality of comparators define a $V_{rms}$-level range for which a unique, discrete feed-forward factor ($K_{VFF}$) is predetermined for any sensed input voltage signal within the $V_{rms}$-level range.

8. The device as recited in claim 1, wherein the discrete predetermined reference voltage levels of each of the plurality of comparators define a $V_{rms}$-level range for which a variable feed-forward factor ($K_{VFF}$) for any sensed input voltage signal within the $V_{rms}$-level range can be generated.

9. The device as recited in claim 1, wherein at least one of the plurality of comparators provides a hysteresis with respect to the discrete, predetermined reference voltage level so that after said reference voltage level has been exceeded a first time, said reference voltage level is reduced by the hysteresis.

10. The device as recited in claim 9, wherein the plurality of comparators has only the comparator in an active state having a highest reference voltage level activates the hysteresis.

11. The device as recited in claim 1, wherein the voltage feed-forward output generated by the logic control circuit corresponds to a unique voltage level or a unique current level within a discrete $V_{rms}$-level range.

12. The device as recited in claim 1, wherein the voltage feed-forward output generated by the logic control circuit does not change unless the sensed input voltage remains above an active level for a predetermined delay time.

13. The device as recited in claim 12, wherein the delay time is less than about 1 milli-second.

14. The device as recited in claim 1, wherein the logic control circuit includes at least one of volatile memory and non-volatile memory and is adapted to store a most recent highest active level corresponding to the sensed input voltage.

15. The device as recited in claim 14, wherein the voltage feed-forward output generated by the logic control circuit changes when the sensed input voltage exceeds the most recent highest active level stored in memory by at least one $V_{rms}$-level range.

16. The device as recited in claim 14, wherein the voltage feed-forward output generated by the logic control circuit changes when the sensed input voltage peak is less than the most recent highest active level stored in memory by at least one $V_{rms}$-level range.

17. A power factor correction control system comprising:

a quantized voltage feed-forward device for providing a quantized voltage feed-forward signal, the device comprising:

a plurality of comparators, each of the plurality of comparators monitoring an instantaneous input voltage signal and to compare the instantaneous input voltage with a discrete, predetermined reference voltage level, and to generate a state signal representative of said comparison; and a logic control circuit that processes the digital state signals from each of the plurality of comparators at an end of each half cycle in the input voltage signal to always determine a peak in the input voltage signal and to generate a discrete voltage feed-forward ratio output that is always representative of a function of the peak input voltage in that half cycle; and a signal multiplier that is structured and arranged to generate an input current reference waveform used to control the power factor of the input voltage which is based in part on the voltage feed-forward factor output generated by the logic control circuit.

18. The system as recited in claim 17 further comprising a voltage error amplifier that is adapted to provide a voltage error amplification signal to the signal multiplier.

19. The system as recited in claim 17 further comprising a scaled and rectified function of the instantaneous input voltage that is applied to the signal multiplier.

20. The system as recited in claim 19, wherein the multiplier is structured and arranged to generate a continuous, current input reference waveform based on a relationship between the scaled and rectified function of the instantaneous input voltage, the voltage feed-forward factor output, a conversion factor, and a voltage error signal.

21. A method of providing a quantized voltage feed-forward signal to a power factor correction control system or other integrated circuit, the method comprising:

comparing an instantaneous input voltage signal with a plurality of discrete, predetermined reference voltage levels;

generating a state signal representative of each of said comparisons at an end of each half cycle in the input voltage signal; and generating a non-continuous, quantized, voltage feed-forward factor output that is always representative of a scaled function of the peak of the input voltage signal based on the state signals.

22. The method as recited in claim 21 further including:

generating a continuous, input current reference waveform to the power factor correction system based on a relationship between the scaled function of the instantaneous input voltage, the quantized, voltage feed-forward factor output, a conversion factor, and a voltage error amplification signal.

23. The method as recited in claim 21, wherein generating the non-continuous, quantized, voltage feed-forward factor includes:

establishing a present input voltage level;

comparing the present input voltage level with a previously-established “active level” of the input voltage; and generating a non-continuous, quantized, voltage feed-forward factor output representative of at least one “active level” of the input voltage and the present input voltage level.

24. The method as recited in claim 21, wherein the non-continuous, quantized, voltage feed-forward factor output generated is representative of the “active level” as long as the present input voltage level is the same or substantially the same as the “active level” or is within one or two $V_{rms}$-levels of the “active level”, otherwise the non-continuous, quantized, voltage feed-forward factor output generated is representative of the present input voltage level.

* * * * *